US011957032B2

(12) United States Patent
Etzkorn et al.

(10) Patent No.: US 11,957,032 B2
(45) Date of Patent: Apr. 9, 2024

(54) DISPLAY SYSTEM (71) Applicant: 3M INNOVATIVE PROPERTIES COMPANY, St. Paul, MN (US)

(72) Inventors: Stephen J. Etzkorn, Woodbury, MN (US); Michael L. Steiner, New Richmond, WI (US); Kevin W. Gotrik, Hudson, WI (US); Luke A. Schroeder, Maplewood, MN (US); Nicholas A. Johnson, Burnsville, MN (US); John A. Wheatley, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/329,745

(22) Filed: Jun. 6, 2023

(65) Prior Publication Data

US 2023/0413653 A1 Dec. 21, 2023

Related U.S. Application Data (60) Provisional application No. 63/351,555, filed on Jun. 13, 2022.

(51) Int. Cl.
*G02B 27/28* (2006.01)
*F21V 9/14* (2006.01)
(Continued)

(52) U.S. Cl.
CPC ........... *H10K 59/8793* (2023.02); *F21V 9/14* (2013.01); *F21V 14/003* (2013.01);
(Continued)

(58) Field of Classification Search
CPC . G02B 30/25; G02B 5/30; G02B 5/18; G02B 5/3025; G02B 6/34; G02B 27/28
See application file for complete search history.

(56) References Cited

U.S. PATENT DOCUMENTS

| | | | | |
|---|---|---|---|---|
| 8,474,980 B2* | 7/2013 | Hsu | ...................... | H04N 13/363 359/464 |
| 2008/0165296 A1* | 7/2008 | Kim | ...................... | H04N 13/359 349/15 |

(Continued)

OTHER PUBLICATIONS

Kim, "Wide-angle nonmechanical beam steering using thin liquid crystal polarization gratings", Proceedings of SPIE, Advanced Wavefront Control: Methods, Devices, and Applications VI, 2008, vol. 7093, pp. 709302-1-709302-12.

*Primary Examiner* — William J Carter
(74) *Attorney, Agent, or Firm* — Jonathan L. Tolstedt (57) ABSTRACT

The present disclosure provides a display system. The display system includes a backlight configured to emit substantially collimated polarized light from an emission surface thereof. The emitted polarized light is polarized along a polarization direction. The display system further includes a display panel configured to receive an illumination light and form an image. The display system further includes a grating system substantially coextensive in length and width with the display panel and the emission surface. The grating system includes a plurality of substantially parallel elongated features extending along an in-plane first direction and arranged along an orthogonal in-plane second direction. The grating system is configured to receive and transmit an incident polarized light as a first transmitted light having different first and second polarization states in response to different respective first and second signals applied to the grating system.

15 Claims, 8 Drawing Sheets

(51) Int. Cl.
*F21V 14/00* (2018.01)
*G02F 1/01* (2006.01)
*G02F 1/035* (2006.01)
*H01L 25/075* (2006.01)
*H01L 25/13* (2006.01)
*H10K 59/80* (2023.01)
*F21Y 115/10* (2016.01)

(52) U.S. Cl.
CPC ......... *G02B 27/286* (2013.01); *G02F 1/0136* (2013.01); *G02F 1/035* (2013.01); *H01L 25/0753* (2013.01); *H01L 25/13* (2013.01); *F21Y 2115/10* (2016.08); *G02F 2202/20* (2013.01)

(56) References Cited

U.S. PATENT DOCUMENTS

| | | | |
|---|---|---|---|
| 2009/0167968 A1* | 7/2009 | Hsu | G02F 1/13362 359/465 |
| 2015/0130751 A1* | 5/2015 | Teraguchi | G06F 3/0412 345/80 |
| 2018/0203241 A1* | 7/2018 | Zha | H04N 13/359 |

* cited by examiner

DISPLAY SYSTEM

TECHNICAL FIELD

The present disclosure relates generally to a display system. Particularly, the present disclosure relates to a switchable display system.

BACKGROUND

Selective viewing films are generally useful to limit viewing access for an electronic display device so that only certain viewing positions are permitted. In general, these limitations are useful for privacy and/or differentiation of differing viewing positions (i.e., dual view display). Privacy films are typically used to protect information visible on screens from persons located at oblique angles. Traditionally, a privacy film is applied to a viewing surface of a privacy display, such that an image content of the privacy display can be viewed selectively at intended angles. Typically, when a viewer is positioned within a range of narrow viewing angles relative to a normal to a surface of the privacy film, the image content being displayed is viewable through the privacy film. As the position of the viewer changes, such that the viewing angle increases relative to the normal, an amount of coherent light transmitted through the privacy film decreases until a maximum viewing angle is reached and the image content being displayed may be no longer viewable, or viewable with a very low intensity. Multiple view displays, similarly, are designed to provide particular views to particular positions in angular space by redirecting peak display brightness.

SUMMARY

In a first aspect, the present disclosure provides a display system. The display system includes a backlight configured to emit substantially collimated polarized light from an emission surface thereof. The emitted polarized light is polarized along a polarization direction. The display system further includes a display panel configured to receive an illumination light and form an image. The display system further includes a grating system substantially coextensive in length and width with the display panel and the emission surface. The grating system includes a plurality of substantially parallel elongated features extending along an in-plane first direction and arranged along an orthogonal in-plane second direction. The grating system is configured to receive and transmit an incident polarized light as a first transmitted light having different first and second polarization states in response to different respective first and second signals applied to the grating system, such that the image formed by the display panel exits the display system as an exiting image having different first and second intensity profiles versus transmission angle in response to the respective first and second signals applied to the grating system.

In a second aspect, the present disclosure provides a display system. The display system includes a light source configured to emit light. The display system further includes a display panel configured to form an image. The display system further includes at least one grating spaced apart from the display panel along a thickness direction of the display system. The at least one grating includes a plurality of substantially parallel elongated features extending along an in-plane first direction and arranged along an orthogonal in-plane second direction. The display system further includes at least one retarder disposed between the at least one grating and the light source. The at least one retarder is configured to have at least different first and second retardation states. At least in a first plane substantially orthogonal to the display panel, the image formed by the display panel and exiting the display system includes different first and second intensity profiles versus transmission angle having respective first and second global maxima at different respective first and second transmission angles in response to the respective first and second retardation states of the at least one retarder.

In a second aspect, the present disclosure provides a display system. The display system includes a display configured to emit substantially collimated polarized image light from an image formed by the display toward a viewer. The emitted polarized image light is polarized along a polarization direction. The display system further includes at least one grating spaced apart from the display along a thickness direction of the display system. The at least one grating is configured to be between the viewer and the display. The at least one grating incudes a plurality of substantially parallel elongated features extending along an in-plane first direction and arranged along an orthogonal in-plane second direction. The display system further includes at least one retarder disposed between the at least one grating and the display. The at least one retarder is configured to have at least different first and second retardation states. At least in a first plane substantially orthogonal to the display, the emitted polarized image light emitted by the display and exiting the display system after passing through the at least one retarder and the at least one grating includes different first and second intensity profiles versus transmission angle having respective first and second global maxima at different respective first and second transmission angles in response to the respective first and second retardation states of the at least one retarder.

BRIEF DESCRIPTION OF THE DRAWINGS

Exemplary embodiments disclosed herein may be more completely understood in consideration of the following detailed description in connection with the following figures. The figures are not necessarily drawn to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying figures that form a part thereof and in which various embodiments are shown by way of illustration. It is to be understood that other embodiments are contemplated and may be made without departing from the scope or spirit of the present disclosure. The following detailed description, therefore, is not to be taken in a limiting sense.

In the following disclosure, the following definitions are adopted.

As used herein, all numbers should be considered modified by the term "about". As used herein, "a," "an," "the," "at least one," and "one or more" are used interchangeably.

As used herein as a modifier to a property or attribute, the term "generally", unless otherwise specifically defined, means that the property or attribute would be readily recognizable by a person of ordinary skill but without requiring absolute precision or a perfect match (e.g., within +/−20% for quantifiable properties).

The term "substantially", unless otherwise specifically defined, means to a high degree of approximation (e.g., within +/−10% for quantifiable properties) but again without requiring absolute precision or a perfect match.

The term "about", unless otherwise specifically defined, means to a high degree of approximation (e.g., within +/−5% for quantifiable properties) but again without requiring absolute precision or a perfect match.

As used herein, the terms "first" and "second" are used as identifiers. Therefore, such terms should not be construed as limiting of this disclosure. The terms "first" and "second" when used in conjunction with a feature or an element can be interchanged throughout the embodiments of this disclosure.

As used herein, "at least one of A and B" should be understood to mean "only A, only B, or both A and B".

As used herein, the term "film" generally refers to a material with a very high ratio of length or width to thickness. A film has two major surfaces defined by a length and width. Films typically have good flexibility and can be used for a wide variety of applications, including displays. Films may also be of thickness or material composition, such that they are semi-rigid or rigid. Films described in the present disclosure may be composed of various polymeric materials. Films may be monolayer, multilayer, or blend of different polymers.

As used herein, the term "layer" generally refers to a thickness of material within a film that has a relatively consistent chemical composition. Layers may be of any type of material including polymeric, cellulosic, metallic, or a blend thereof. A given polymeric layer may include a single polymer-type or a blend of polymers and may be accompanied by additives. A given layer may be combined or connected to other layers to form films. A layer may be either partially or fully continuous as compared to adjacent layers or the film. A given layer may be partially or fully coextensive with adjacent layers. A layer may contain sub-layers.

The present disclosure relates to a display system with a switchable feature. The display system may be used with electronic devices, such as computer monitors, televisions, mobile phones, personal digital assistants (PDAs), laptops, notebooks, wearable devices, infotainment display, advertisement display boards, and other portable electronic devices.

Electronically switchable displays are currently available in the market. An electronically switchable display typically has a non-removable configuration, i.e., a user can switch between sharing and privacy modes without a need to remove any film from a viewing surface of the display. Conventional electronically switchable displays usually absorb light at wider viewing angles (i.e., viewing angles greater than intended viewing angles relative to a normal to the display) while transmitting the light at narrow viewing angles (i.e., viewing angles within the intended viewing angles relative to the normal to the display).

However, such displays may not work adequately when it is desired that image content is to be viewed at the same time by an on-axis viewer (located at viewing angles close to a normal to the display) as well as an off-axis viewer located at smaller viewing angles relative to the normal. This particular setting may be required in some application areas. In other words, conventional switchable displays may not enable switching between a mode in which the image content is visible to the on-axis viewer and a mode in which the image content is visible to the on-axis viewer as well as a viewer located at smaller viewing angles relative to the normal. Moreover, conventional switchable displays may not enable switching between a mode in which the image content is visible to the viewer located at smaller positive viewing angles relative to the normal and a mode in which the image content is visible to the viewer located at smaller negative viewing angles relative to the normal.

The present disclosure provides a display system. The display system includes a backlight configured to emit substantially collimated polarized light from an emission surface thereof. The emitted polarized light is polarized along a polarization direction. The display system further includes a display panel configured to receive an illumination light and form an image. The display system further includes a grating system substantially coextensive in length and width with the display panel and the emission surface. The grating system includes a plurality of substantially parallel elongated features extending along an in-plane first direction and arranged along an orthogonal in-plane second direction. The grating system is configured to receive and transmit an incident polarized light as a first transmitted light having different first and second polarization states in response to different respective first and second signals applied to the grating system, such that the image formed by the display panel exits the display system as an exiting image having different first and second intensity profiles versus transmission angle in response to the respective first and second signals applied to the grating system.

As the exiting image has different first and second intensity profiles versus the transmission angle in response to the respective first and second signals applied to the grating system, the display system may be switched between a mode having the first intensity profile of the exiting image and a mode having the second intensity profile of the exiting image. In some cases, in response to the first signal applied to the grating system, a relative intensity of the exiting image is greater at smaller positive viewing angles than at smaller negative viewing angles. Further, in response to the second signal applied to the grating system, the relative intensity of the exiting image is greater at the smaller negative viewing angles than at the smaller positive viewing angles.

By having the different first and second intensity profiles of the exiting image, the display system of the present disclosure may be switched between the mode in which the image content is clearly visible to the viewer located at the smaller positive viewing angles and the mode in which the image content is clearly visible to the viewer located at the smaller negative viewing angles. In other words, the image content may be clearly visible to the viewer located at the smaller positive viewing angles in response to the first signal applied to the grating system. Further, the image content may be clearly visible to the viewer located at the smaller negative viewing angles in response to the second signal applied to the grating system. Furthermore, when there is no signal applied to the grating system, the image content may be clearly visible to the on-axis viewer as well as both the viewer at the smaller negative angle and the viewer at the smaller positive angle. A user may select either one or none of the first and second signals based on desired application attributes. Based on the signal (i.e., one of the first signal and the second signal, or no signal) applied to the grating system, the display system of the present disclosure may be switched between various modes having different intensity profiles. Therefore, the display system of the present disclosure may be switched between multiple viewing angles.

In some embodiments, in a plane substantially orthogonal to the display panel, the first and second intensity profiles have respective first and second global maxima at different respective first and second transmission angles. The first and second transmission angles are at least 5 degrees apart. In some cases, the first and second transmission angles are at least 19 degrees apart for a sample with +/−10 degree shift. This separation could be higher by adjusting either the output of the display system to a narrower output, or by increasing the strength of the grating. Gratings having a 40 degree shift (−40, 40) from zero are known. As the first and second intensity profiles have respective first and second global maxima at the respective first and second transmission angles which are at least 5 degrees apart, the first and second intensity profiles may be distinctly separate from each other with minimum overlap. Hence, the display system of the present disclosure may provide various intensity profiles of the exiting image at the different respective transmission angles based on the signal (i.e., one of the first signal and the second signal, or no signal) applied to the grating system thereby enabling switching between multiple viewing angles.

For dual view applications, such as driver and passenger positions in an automobile, the display system of the present disclosure finds utility to actively alter the direction of the maximum display brightness as required into two distinct positions. In other scenarios, this technology could be used in advertising, to change the luminance of the display system based on the location of a passing viewer.

Most generally, this display system of the present disclosure provides a means to have display luminance optimized for a viewer at location A, then when "switched", the luminance would be maximized now for a viewer located at a different position B. Of course, by adjusting the signal it is possible to provide some mixture of these 2 states (i.e., allow viewing in the region between points A and B).

Figure 1:
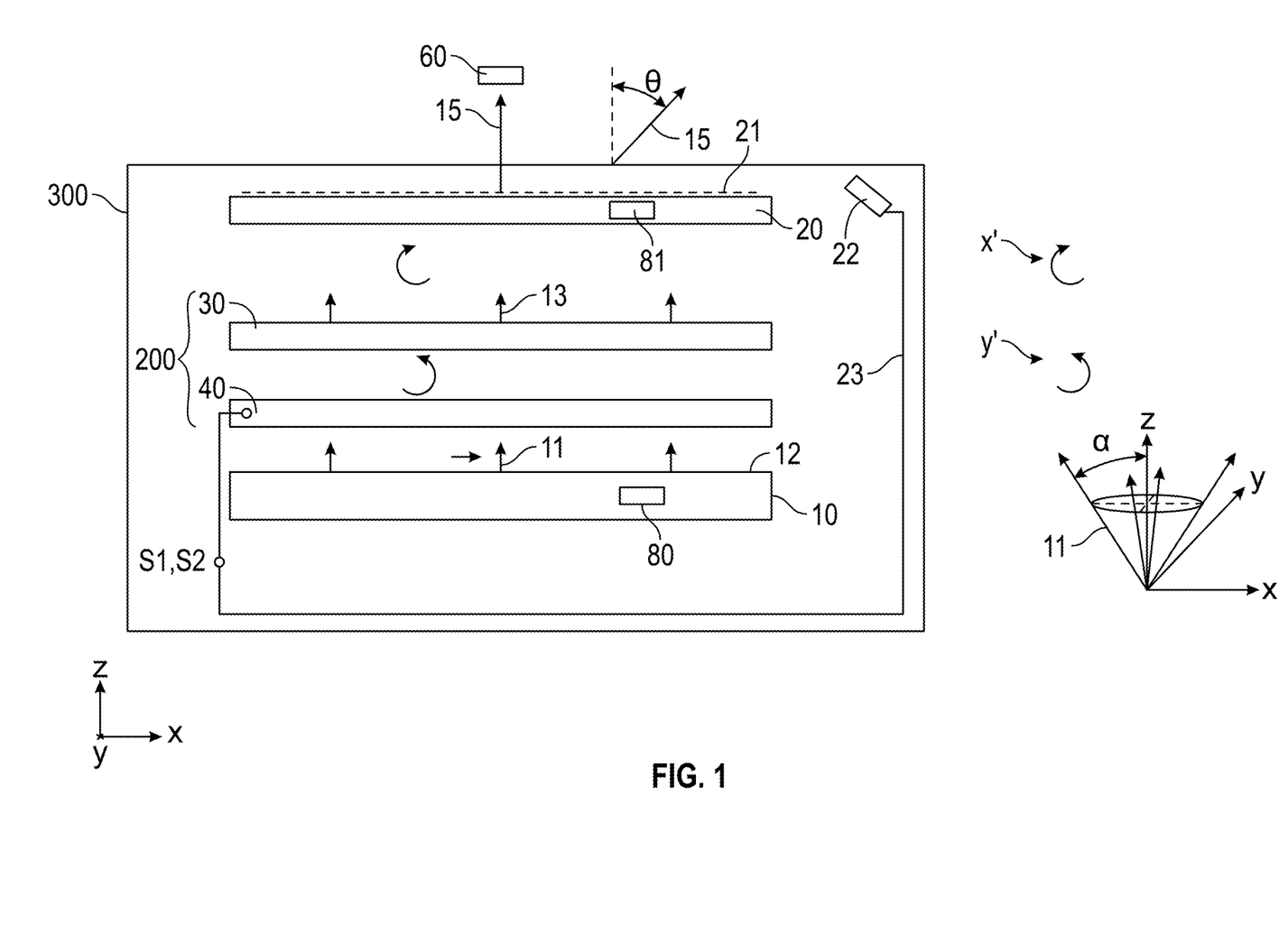
FIG. 1 is a schematic sectional view of a display system, according to an embodiment of the present disclosure.

Referring now to FIG. 1, a display system 300 is illustrated according to an embodiment of the present disclosure. The display system 300 defines mutually orthogonal x, y, and z-axes. The x and y-axes are in-plane axes of the display system 300, while the z-axis is a transverse axis disposed along a thickness of the display system 300. In other words, the x and y-axes are disposed along a plane of the display system 300, while the z-axis is perpendicular to the plane of the display system 300.

The display system 300 includes a backlight 10 configured to emit substantially collimated polarized light 11 from an emission surface 12 thereof. In some embodiments, the backlight 10 can be interchangeably referred to herein as "the light source 10" and the emitted polarized light 11 can be interchangeably referred to herein as "the light 11". In other words, the light source 10 is configured to emit the light 11. In some embodiments, the backlight 10 includes at least one micro light emitting diode (micro-LED) 80 as an illuminating source. In the illustrated embodiment of FIG. 1, the at least one micro-LED 80 includes only one micro-LED 80. In other embodiments, at least one micro-LED 80 may include any number of micro-LEDs 80 as per desired application attributes. In some embodiments, the at least one micro-LED 80 is a visible light source. Alternatively, the backlight 10 may include at least one of filament or arc lamps, linear cold cathode fluorescent tubes, non-linear cold cathode fluorescent tubes, flat fluorescent panels, and external electrode fluorescent lamps. The backlight 10 may further include a reflector, diffusing layers, light collimating layers, reflective polarizers, absorbing polarizers, and so on.

In the illustrated embodiment of FIG. 1, the emitted polarized light 11 is polarized along a polarization direction (i.e., the x-axis in FIG. 1). In some embodiments, a maximum half divergence angle $\alpha$ of the emitted substantially collimated polarized light 11 is less than about 30 degrees. In some embodiments, the maximum half divergence angle $\alpha$ of the emitted polarized light 11 is less than about 25 degrees, less than about 20 degrees, less than about 15 degrees, less than about 10 degrees, or less than about 5 degrees.

The display system 300 further includes a display panel 20 configured to receive an illumination light and form an image 21. In some embodiments, the display panel 20 can be interchangeably referred to herein as "the display 20". In some embodiments, the display 20 includes a liquid crystal display (LCD). In some embodiments, the display 20 includes at least one micro-LED 81. In some embodiments, the display 20 includes an organic light emitting display (OLED). In the illustrated embodiment, the display 20 includes one micro-LED 81. However, the display 20 may include any number of micro-LEDs 81 as per desired application attributes.

The display system 300 further includes a grating system 200 substantially coextensive in length (i.e., along the x-axis) and width (i.e., along the y-axis) with the display panel 20 and the emission surface 12. Specifically, the grating system 200, the display panel 20, and the emission surface 12 may be substantially co-extensive with each other in the in-plane axes of the display system 300 (i.e., the x-y plane). The grating system 200 includes at least one grating 30 spaced apart from the display panel 20 along a thickness direction (i.e., along the z-axis) of the display system 300. In the illustrated embodiment of FIG. 1, the at least one grating 30 includes only one grating 30. With reference to FIG. 1, the at least one grating 30 can be interchangeably referred to herein as "the grating 30".

In some embodiments, the at least one grating 30 includes a Pancharatnam-Berry (PB) phase lens. One of the properties of a PB phase lens is to modulate a phase shift using liquid crystal (LC) molecules to provide a special profile depending on a polarization state of an input light or an input image. The PB phase lens exhibits distinct polarization selectivity, manifesting opposite optical power to circularly polarized light with opposite handedness. In general, upon incidence of a light having right circularly polarization state, the PB phase lens is activated as a convex lens and an output light is modulated to have left circularly polarization state. Similarly, the PB phase lens operates as a concave lens for an incident light having left circularly polarization state and an output light is modulated to have right circularly polarization state.

Figure 2:
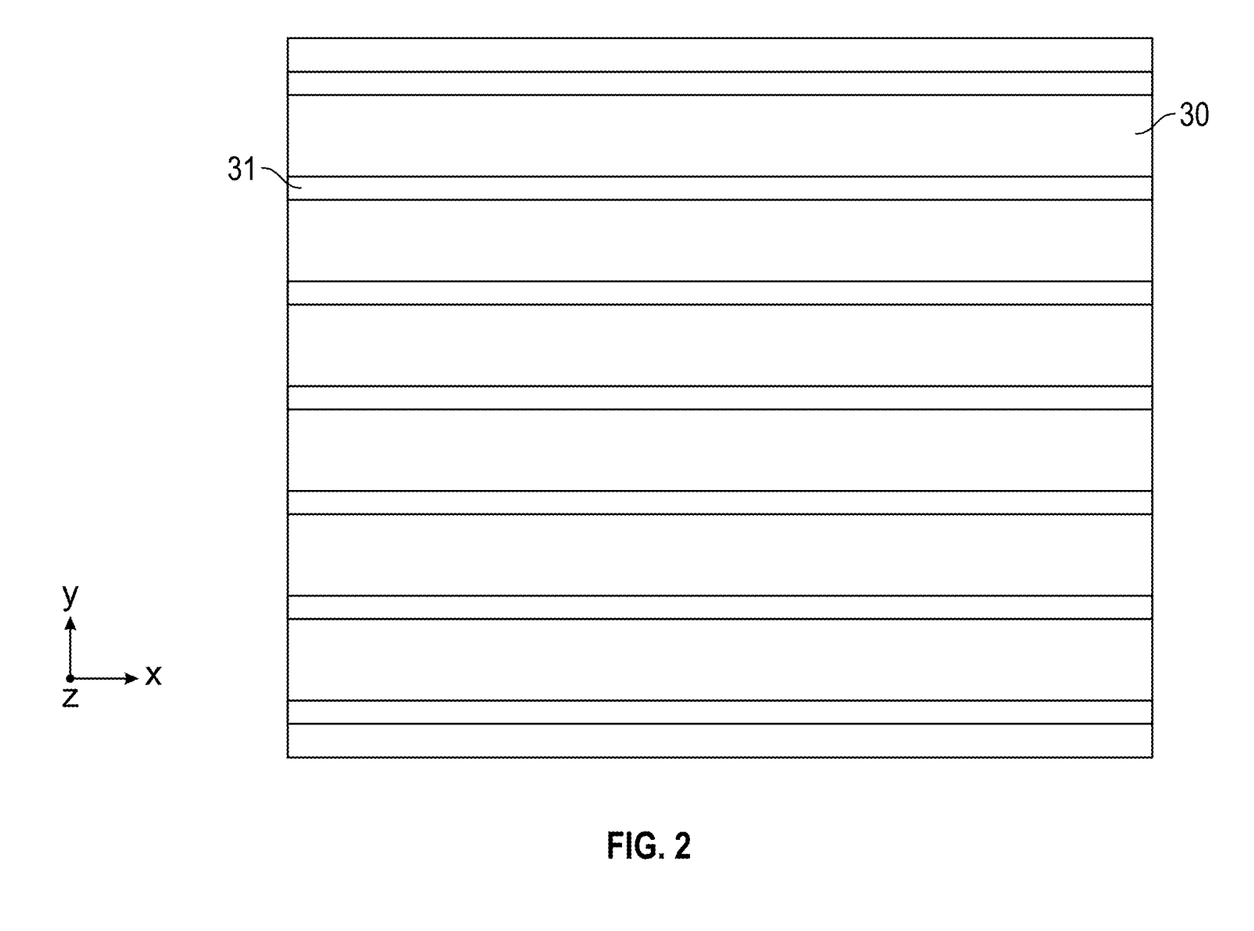
FIG. 2 is a schematic top view of at least one grating of the display system, according to an embodiment of the present disclosure.

FIG. 2 is a schematic top view of the at least one grating 30, according to an embodiment of the present disclosure. Referring to FIGS. 1 and 2, the at least one grating 30 includes a plurality of substantially parallel elongated features 31 extending along an in-plane first direction (i.e., along the x-axis) and arranged along an orthogonal in-plane second direction (i.e., along the y-axis). In other words, the grating system 200 includes the plurality of substantially parallel elongated features 31. In some embodiments, the elongated features 31 may extend along the in-plane second direction (i.e., along the y-axis) and arranged along the in-plane first direction (i.e., along the x-axis).

The grating system 200 further includes at least one retarder 40 disposed between the at least one grating 30 and the light source 10. In the illustrated embodiment of FIG. 1, the at least one retarder 40 includes only one retarder 40. With reference to FIG. 1, the at least one retarder can be interchangeably referred to herein as "the retarder 40" or "the switchable retarder 40". The at least one retarder 40 is configured to have at least different first and second retardation states. In some embodiments, the first retardation state can be interchangeably referred to herein as "the first retarder state", and the second retardation state can be interchangeably referred to herein as "the second retarder state".

In some embodiments, the at least one retarder 40 includes one or more of a Pockels cell and a Soleil-Babinet compensator. In general, the Pockels cell is a voltage controlled waveplate and includes an electro-optic material, such as an electro-optic crystal (e.g., LiNbO3 or LiTaO3), whose refractive index changes by applying a signal, such as a voltage signal, to the electro-optic material. The phase of a polarized light beam passing through the electro-optic material of the Pockels cell can be changed by the application of the voltage signal. Therefore, applying a prescribed voltage to the Pockels cell may result in a predetermined alteration of a polarization property of a light beam passing through the Pockels cell.

The Soleil-Babinet compensator is a mechanically controlled waveplate and includes two birefringent wedges, one of which is capable of moving with respect to (sliding against) the other to change the effective thickness of the waveplate. Hence, the phase of a polarized light beam passing through the Soleil-Babinet compensator can be changed by the movement of the wedges relative to each other. In some cases, the Soleil-Babinet compensator incudes two wedges of quartz, cut with their optical axes perpendicular to each other.

The grating system 200 is configured to receive and transmit an incident polarized light and transmit as a first transmitted light 13 having different first and second polarization states in response to different respective first and second signals S1, S2 applied to the grating system 200. In some embodiments, each of the applied first and second signals S1, S2 includes one or more of a voltage signal and a current signal. In some embodiments, the first and second polarization states are orthogonal to each other. In some embodiments, the first and second polarization states are circularly polarization states. In some embodiments, the first polarization state is a right circularly polarization state (denoted by x' in FIG. 1) and the second polarization state is a left circularly polarization state (denoted by y' in FIG. 1). In other words, the first and second polarization states are right and left circularly polarization states, respectively. In some other embodiments, the first and second polarization states are linear polarization states. In some embodiments, the first polarization state is along the x-axis, while the second polarization state is along the y-axis.

In some embodiments, the display system 300 further includes a sensor 22 configured to detect a location of a viewer 60 viewing the display panel 20. The sensor 22 is further configured to applying a sensor signal 23 to the grating system 200. The applied sensor signal 23 changes as a viewing angle (i.e., a transmission angle θ) of the viewer 60 changes. In some embodiments, the applied sensor signal 23 is configured to maintain a brightness of an image viewed by the viewer as the viewing angle of the viewer 60 (i.e., the transmission angle θ) changes. In other words, based on the sensor signal 23 applied by the sensor 22, either one or none of the first and second signals S1, S2 may be applied to the grating system 200 to maintain the brightness of the image viewed by the viewer 60.

In the illustrated embodiment of FIG. 1, the grating system 200 is disposed between the display panel 20 and the emission surface 12 of the backlight 10. Therefore, the illumination light is the first transmitted light 13, and the incident polarized light is the polarized light 11 emitted by the backlight 10. Further, the switchable retarder 40 is disposed between the grating 30 and the emission surface 12. The switchable retarder 40 is configured to receive and transmit the emitted polarized light 11 from the emission surface 12 as the first transmitted light 13 having the different first and second polarization states when the switchable retarder 40 is in the different respective first and second retarder states. Upon receiving the illumination light (i.e., the first transmitted light 13), the image 21 formed by the display panel 20 exits the display system 300 as an exiting image 15. In the illustrated embodiment of FIG. 1, the exiting image 15 is the image 21 formed by the display panel 20.

Figure 3:
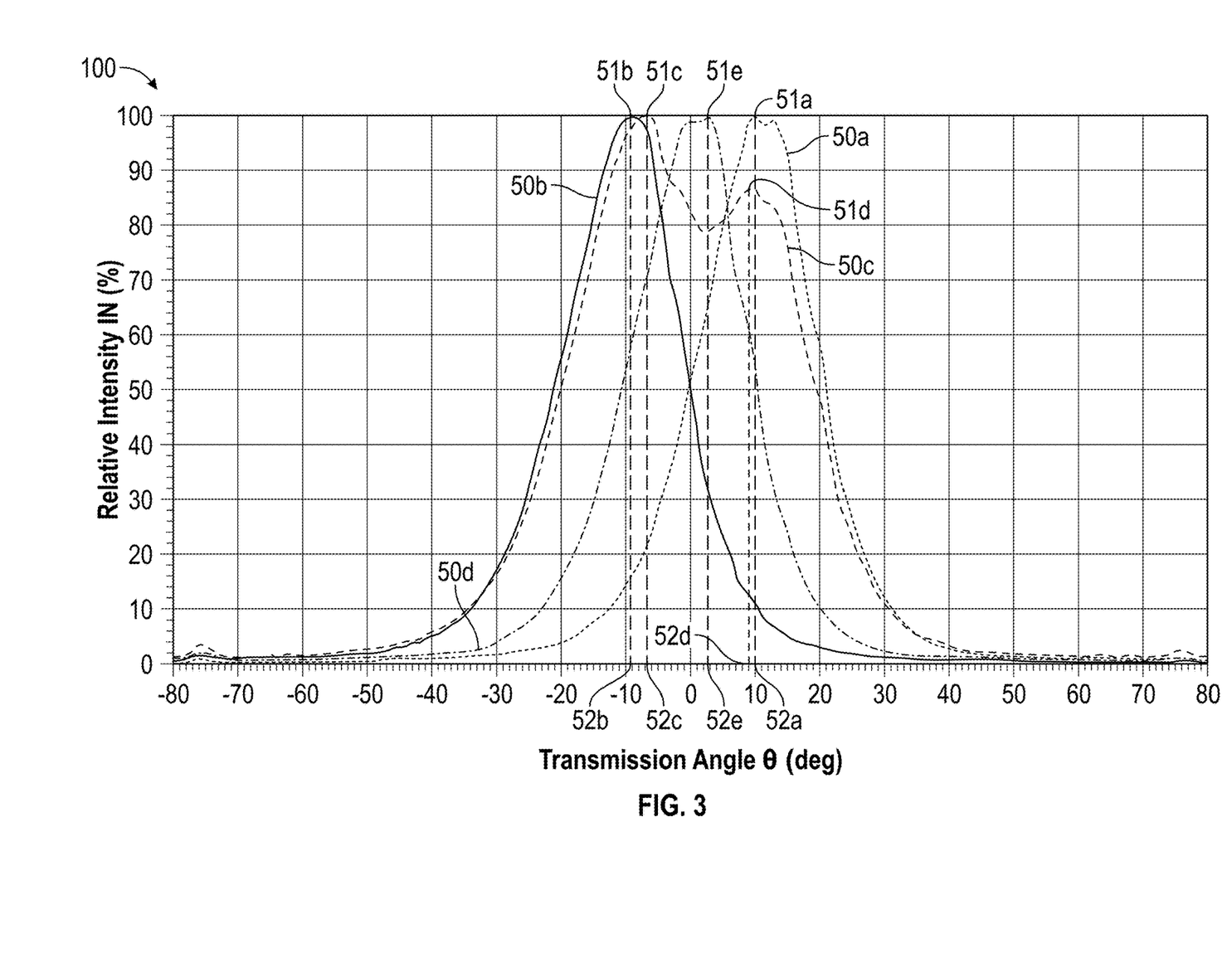
FIG. 3 is a graph illustrating relative intensity versus transmission angle for the display system of FIG. 1, according to an embodiment of the present disclosure.

FIG. 3 is a graph 100 illustrating relative intensity IN versus the transmission angle θ (half polar angle or half angle for an emitted image cone) for the display system 300 shown in FIG. 1, according to an embodiment of the present disclosure. The relative intensity IN is expressed as an intensity percentage in the ordinate. The transmission angle θ is expressed in degrees in the abscissa.

Referring to FIGS. 1 and 3, the exiting image 15 has different first and second intensity profiles 50a, 50b versus the transmission angle θ in response to the respective first and second signals S1, S2 applied to the grating system 200. Specifically, at least in a first plane (i.e., x-z plane) substantially orthogonal to the display panel 20, the image 21 formed by the display panel and exiting the display system 300 as the exiting image 15 includes the different first and second intensity profiles 50a, 50b versus the transmission angle θ in response to the respective first and second retardation states of the at least one retarder 40. The first plane can be interchangeably referred to herein as "the plane" (i.e., the x-z plane).

Further, in the plane substantially orthogonal to the display panel 20, the first and second intensity profiles 50a, 50b have respective first and second global maxima 51a, 51b at different respective first and second transmission angles 52a, 52b. In some embodiments, the first and second transmission angles 52a, 52b are at least 5 degrees apart. In some embodiments, the first and second transmission angles 52a, 52b may be at least 7 degrees apart, at least 9 degrees apart, at least 11 degrees apart, at least 13 degrees apart, at least 15 degrees apart, at least 17 degrees apart, or at least 19 degrees apart. In the illustrated embodiment of FIG. 3, the first and second transmission angles 52a, 52b are about 19 degrees apart.

In some embodiments, if the switchable retarder 40 is removed from the display system 300, then in the plane (i.e., the x-z plane) substantially orthogonal to the display panel 20, the exiting image 15 has an intensity profile 50c having first and second peaks 51c, 51d at different respective first and second transmission angles 52c, 52d. In some embodiments, the first and second transmission angles 52c, 52d are at least 10 degrees apart. In the illustrated embodiment of FIG. 3, the first and second transmission angles 52c, 52d are about 15 degrees apart. In some embodiments, if the grating system 200 is removed from the display system 300, then in the plane (i.e., the x-z plane) substantially orthogonal to the display panel 20, the exiting image 15 has an intensity profile 50d having a global peak 51e at a transmission angle 52e of between about −10 and about 10 degrees. In the illustrated embodiment of FIG. 3, the transmission angle 52e is about 3 degrees.

Figure 4A:
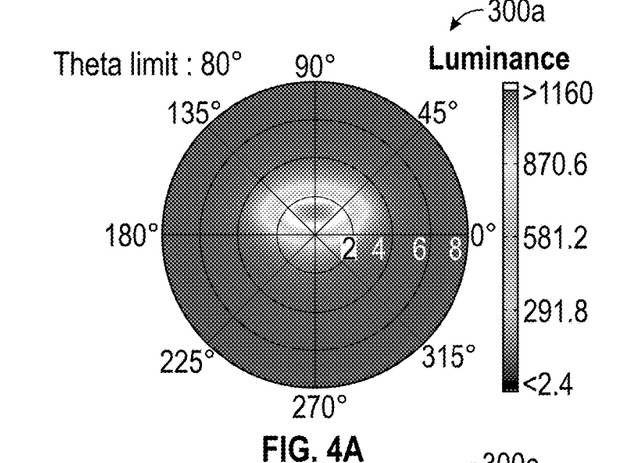
FIGS. 4A to 4D are conoscopic plots of luminance for the display system, according to an embodiment of the present disclosure.
Figure 4B:
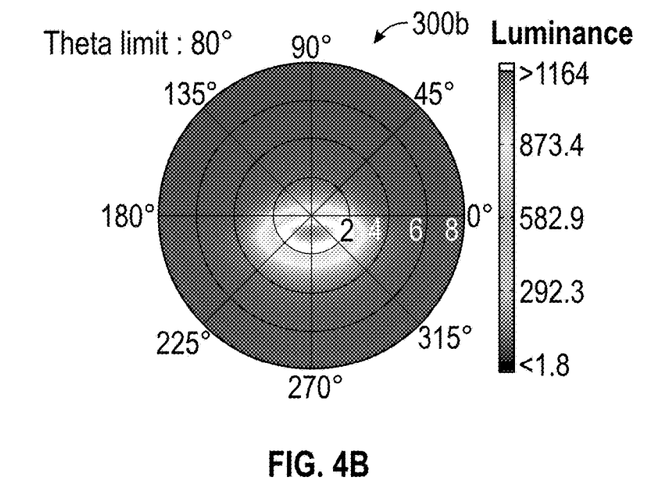
Figure 4C:
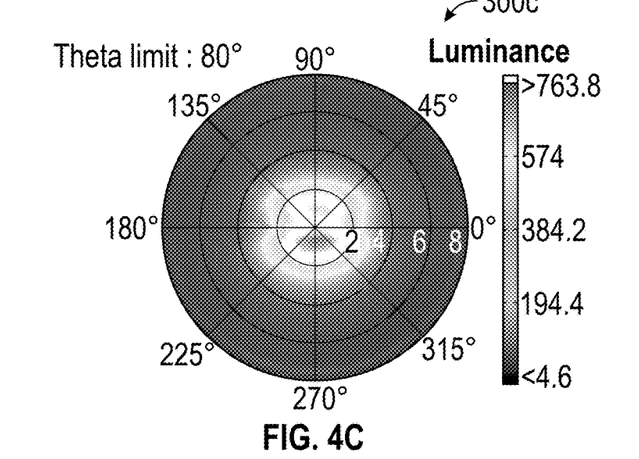
Figure 4D:
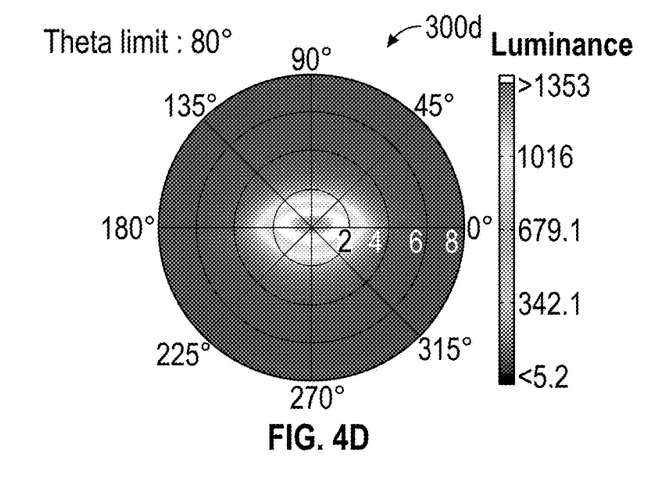

FIGS. 4A to 4D are conoscopic plots of luminance of the display system of FIG. 1, according to an embodiment of the present disclosure. Particularly, FIG. 4A depicts a conoscopic plot 300a of the luminance of the display system 300 when the switchable retarder 40 is in the first retarder state, i.e., the first transmitted light 13 has the first polarization state in response to the first signal S1 applied to the grating system 200. FIG. 4B depicts a conoscopic plot 300b of the luminance of the display system 300 when the switchable retarder 40 is in the second retarder state, i.e., the first transmitted light 13 has the second polarization state in response to the second signal S2 applied to the grating system 200. FIG. 4C depicts a conoscopic plot 300c of the luminance of the display system 300 when the switchable retarder 40 is removed from the display system 300. FIG. 4D depicts a conoscopic plot 300d of the luminance of the display system 300 when the grating system 200 is removed from the display system 300.

Referring to FIGS. 1, 3, and 4A to 4D, as the exiting image 15 has different first and second intensity profiles 50a, 50b versus the transmission angle θ in response to the respective first and second signals S1, S2 applied to the grating system 200, the display system 300 may be switched between a mode having the first intensity profile 50a of the exiting image 15 and a mode having the second intensity profile 50b of the exiting image 15 by the different first and second signals S1, S2 applied to the grating system 200. Also, as depicted in FIGS. 3 and 4A, in response to the first signal S1 applied to the grating system 200, the relative intensity IN (depicted by the first intensity profile 50a) of the exiting image 15 is at least 50% at the smaller positive viewing angles (i.e., the transmission angle θ ranging between 0 degree and 20 degrees). In response to the second signal S2 applied to the grating system 200, the relative intensity IN (depicted by the second intensity profile 50b) of the exiting image 15 is at least 50% at smaller negative viewing angles (i.e., the transmission angle θ ranging between 0 degree and −20 degrees).

The different first and second intensity profiles 50a, 50b of the exiting image 15 may enable the display system 300 to be switched between the mode in which an image content (e.g., the exiting 15) is clearly visible to the viewer 60 located at the smaller positive viewing angles and the mode in which the image content is clearly visible to the viewer 60 located at the smaller negative viewing angles. In other words, the image content may be clearly visible to the viewer located at the smaller positive viewing angles in response to the first signal S1 applied to the grating system 200. Further, the image content may be clearly visible to the viewer 60 located at the smaller negative viewing angles in response to the second signal S2 applied to the grating system 200. Furthermore, when there is no signal applied to the grating system 200, the image content may be clearly visible to an on-axis viewer (i.e., the viewer 60 located at the transmission angles θ ranging between about −10 degrees and +10 degrees). A user may select either one or none of the first and second signals S1, S2 based on desired application attributes. Based on the signal (i.e., one of the first signal S1 and the second signal S2, or no signal) applied to the grating system 200, the display system 300 may be switched between various modes having different intensity profiles. Therefore, the display system 300 is a switchable display system which is adapted to be switched between multiple viewing angles.

As already stated above, as the first and second intensity profiles 50a, 50b have the respective first and second global maxima 51a, 51b at the respective first and second transmission angles 52a, 52b which are at least 5 degrees apart (19 degrees apart in some cases), the first and second intensity profiles 50a, 50b may be distinctly separate from each other with minimum overlap. Hence, the display system 300 may provide various intensity profiles of the exiting image at the different respective transmission angles based on the signal (i.e., one of the first signal S1 and the second signal S2, or no signal) applied to the grating system 200 thereby enabling switching between multiple viewing angles.

As depicted in FIGS. 1, 3 and 4C, upon removal of the switchable retarder 40 from the display system 300, the relative intensity IN (depicted by the intensity profile 50c) of the exiting image 15 is at least 40% at the transmission angle θ ranging between −20 degrees to +20 degrees. Hence, the image content may be visible to any viewer located within a range of the viewing angles from about −20 degrees to +20 degrees. Therefore, upon removal of the switchable retarder 40 from the display system 300, the display system 300 may not switch between multiple viewing positions. Further, upon removal of the switchable retarder 40 from the display system 300, the exiting image 15 may be visible to the on-axis viewer as well as a viewer located at smaller oblique angles. In other words, when the switchable retarder 40 is removed from the display system 300, there may be no means for switching the display system 300, such that the image content is only clearly visible to a viewer at a desirable viewing angle or a desirable viewing angle range.

As depicted in FIGS. 1, 3 and 4D, upon removal of the grating system 200 from the display system 300, the relative intensity IN (depicted by the intensity profile 50d) of the exiting image 15 is at least 40% at the transmission angle θ ranging between −10 degrees to +10 degrees. Hence, the image content may be only clearly visible to the on-axis viewer (i.e., the viewer 60 located at the viewing angle ranging between −10 degrees to +10 degrees). Therefore, upon removal of the grating system 200 from the display system 300, the display system 300 may not be switched between multiple viewing positions. Further, upon removal of the grating system 200 from the display system 300, a viewer located at oblique viewing angles may not be able to view the image content even if the on-axis viewer desires to do so.

Figure 5:
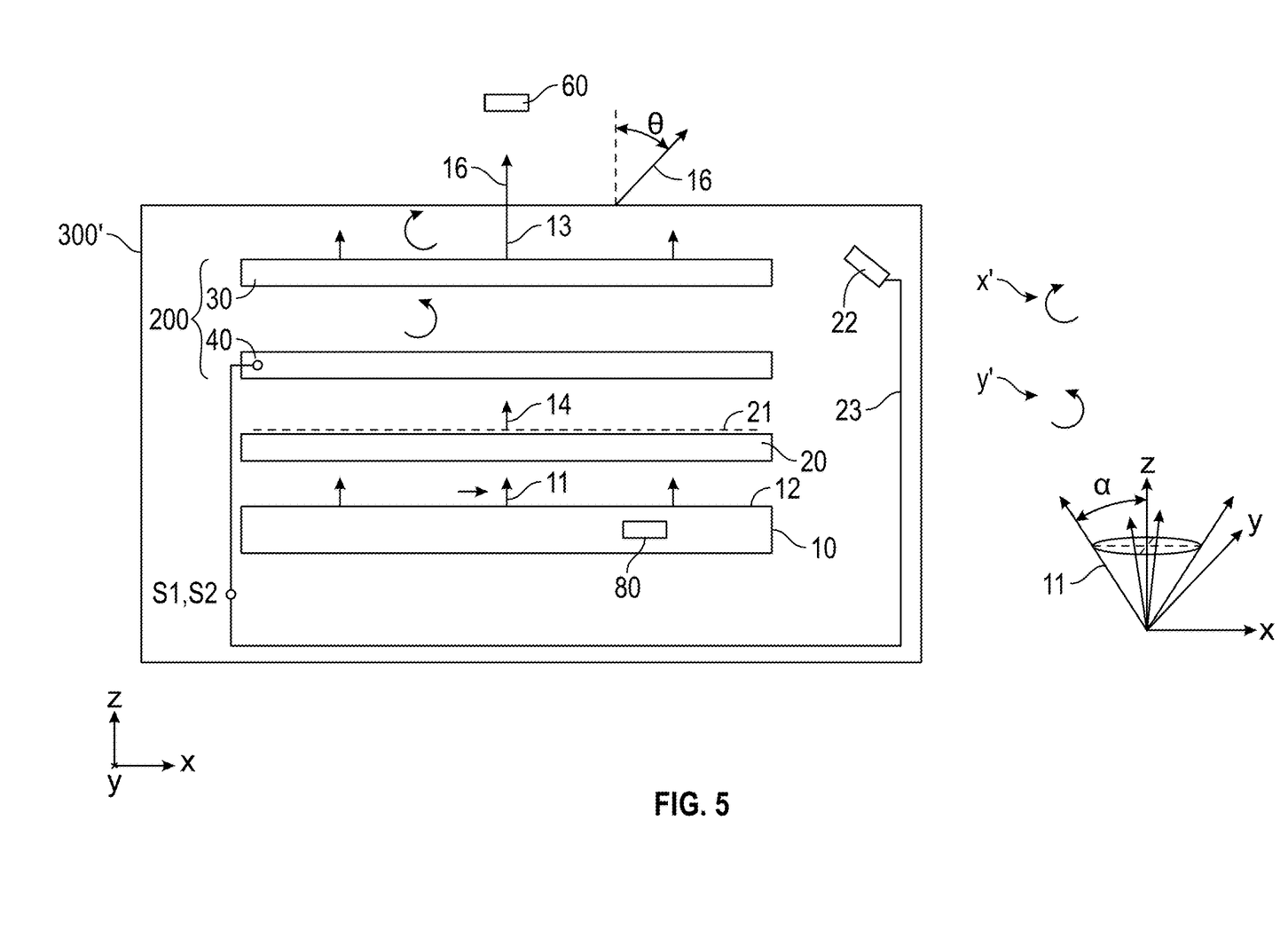
FIG. 5 is a schematic sectional view of a display system, according to another embodiment of the present disclosure.

FIG. 5 is a schematic sectional view of a display system 300', according to another embodiment of the present disclosure. The display system 300' is substantially similar to the display system 300 of FIG. 1, with like elements designated by like reference characters. However, in the display system 300', the display panel 20 is disposed between the grating system 200 and the emission surface 12 of the backlight 10. Therefore, in this embodiment, the illumination light is the polarized light 11 emitted by the backlight 10. Further, in the display system 300', the display 20 is configured to emit substantially collimated polarized image light 14 from the image 21 formed by the display 20 toward the viewer 60. The emitted polarized image light 14 is polarized along a polarization direction (e.g., the x-axis). In some embodiments, the polarized image light 14 can be interchangeably referred to herein as "the light 14". Therefore, in the display system 300', the incident polarized light is the light 14 formed by the display panel 20.

Further, the at least one grating 30 is configured to be between the viewer 60 and the display 20. The switchable retarder 40 is disposed between the grating 30 and the display panel 20. In other words, the at least one retarder 40 is disposed between the at least one grating 30 and the display 20. The switchable retarder 40 is configured to receive and transmit the light 14 formed by the display panel 20 as the first transmitted light 13 having the different first and second polarization states when the switchable retarder 40 is in the different respective first and second retarder states.

Upon receiving the illumination light (i.e., the polarized light 11), the image 21 formed by the display panel 20 exits the display system 300' as an exiting image 16 (instead of the exiting image 15 in the display system 300 of FIG. 1). In the illustrated embodiment of FIG. 5, the exiting image 16 is the first transmitted light 13 including at least portions of the image 21 formed by the display panel 20.

Referring to FIGS. 1, 3, 4, and 5, optical characteristics of the exiting image 16 (shown in FIG. 5) are equivalent to that of the exiting image 15 (shown in FIG. 1). Moreover, the graph 100 of FIG. 3 is applicable to the display system 300' of FIG. 5. Therefore, at least in the first plane (i.e., the x-z plane) substantially orthogonal to the display 20, the polarized image light 14 emitted by the display 20 and exiting the display system 300' as the exiting image 16 after passing through the at least one retarder 40 and the at least one grating 30 includes the different first and second intensity profiles 50a, 50b versus the transmission angle θ. Hence, a functional advantage of the display system 300' is substantially similar to that of the display system 300 of FIG. 1.

Figure 6:
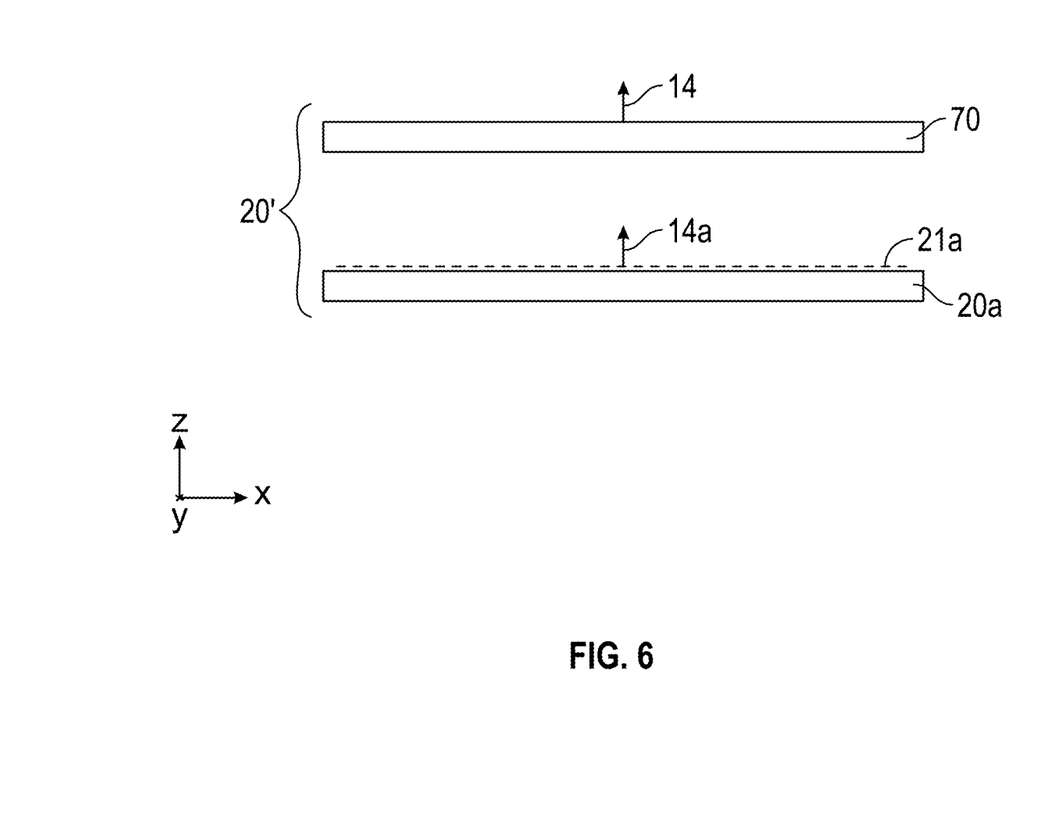
FIG. 6 is a schematic sectional view of a display of the display system of FIG. 5, according to an embodiment of the present disclosure.

FIG. 6 is a schematic sectional view of a display 20', according to an embodiment of the present disclosure. The display 20' is substantially similar to the display 20 of FIG. 5, with like elements designated by like reference characters. However, the display 20' includes an emissive display 20a configured to emit substantially collimated unpolarized image light 14a from an image 21a formed by the display 20' toward the viewer 60. The display 20' further includes a polarizer disposed on the emissive display 20a, such that the emitted unpolarized image light 14a is transmitted by the polarizer 70 as the emitted polarized image light 14 polarized along the polarization direction (e.g., the x-axis). In some embodiments, the emissive display 20a includes an OLED.

Figure 7:
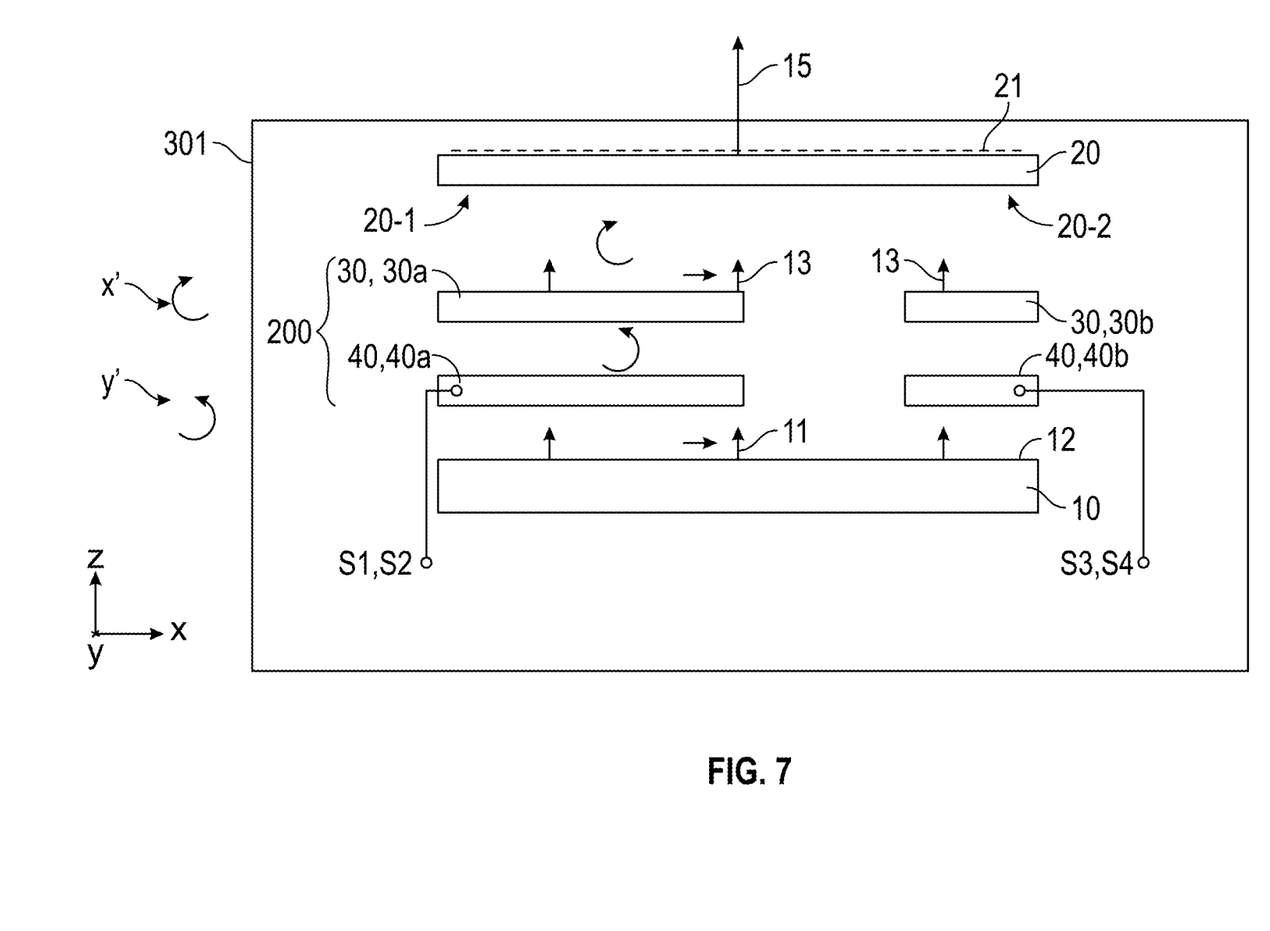
FIG. 7 is a schematic sectional view of a display system, according to another embodiment of the present disclosure.

FIG. 7 is a schematic sectional view of a display system 301, according to another embodiment of the present disclosure. The display system 301 is functionally equivalent to the display system 300 of FIG. 1, with like elements designated by like reference characters. However, the display system 301 includes a grating system 201 that is also functionally equivalent to the grating system 200 of FIG. 1, with like elements designated by like reference characters. In the grating system 201 of the display system 301, the at least one grating 30 includes a plurality of gratings 30a, 30b. In the illustrated embodiment of FIG. 7, the at least one grating 30 includes two gratings 30a, 30b in total. In some other embodiments, the at least one grating 30 may include any number of gratings 30, as per desired application attributes. Similarly, the at least one retarder 40 includes a plurality of retarders 40a, 40b. In the illustrated embodiment of FIG. 7, the at least one retarder 40 includes two retarders 40a, 40b in total. In some other embodiments, the at least one retarder 40 may include any number of retarders 40, as per desired application attributes.

As shown in FIG. 7, the gratings 30a, 30b and the retarders 40a, 40b are aligned with each other in one-to-one correspondence. The pairs of corresponding gratings 30a, 30b and retarders 40b cover different portions 20-1, 20-2 of the display panel 20. In the display system 301, the first transmitted light 13 emitted from the grating 30a has the different first and second polarization states in response to the different respective first and second signals S1, S2 applied to the grating system 201. Further, the first transmitted light 13 emitted from the grating 30b has the different first and second polarization states in response to the different respective third and fourth signals S3, S4 applied to the grating system 201.

Moreover, in the first plane (i.e., the x-z plane), images (not shown) formed in at least two of the different portions 20-1, 20-2 of the display panel 20 and exiting the display system 301 as the exiting image 15 have different intensity profiles (not shown) versus the transmission angle θ.

Figure 8A:
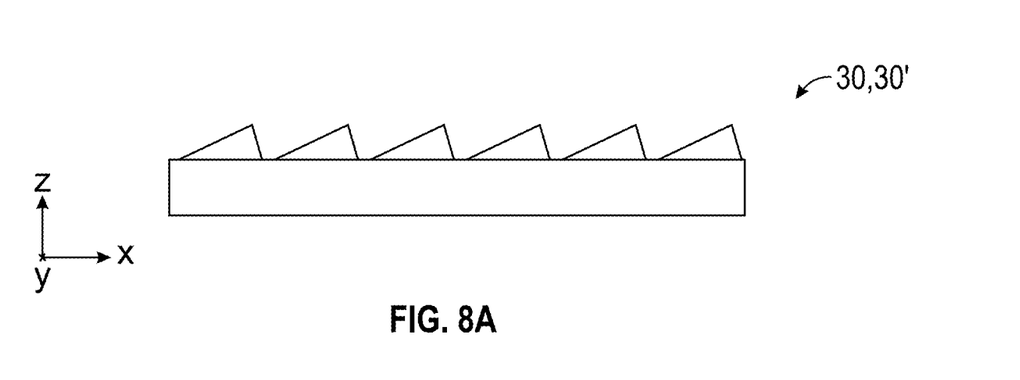
FIGS. 8A and 8B are schematic sectional views of different types of a grating of the display system, according to an embodiment of the present disclosure.
Figure 8B:
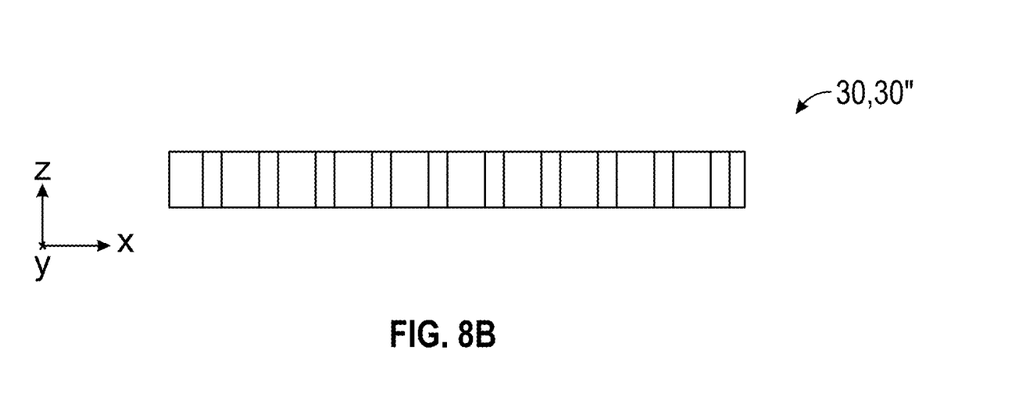

FIGS. 8A and 8B are schematic sectional views of the at least one grating 30 of the display systems 300, 300', 301 of respective FIGS. 1, 5, and 7, according to an embodiment of the present disclosure. In some embodiments, the at least one grating 30 includes one or more of a surface grating 30' and a volume grating 30". In the illustrated embodiment of FIG. 8A, the at least one grating 30 is a surface grating 30'. In the illustrated embodiment of FIG. 8B, the at least one grating 30 is a volume grating 30". In a display system, type of the at least one grating 30 may be selected based on desired application attributes.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A display system comprising:
 a backlight configured to emit substantially collimated polarized light from an emission surface thereof, the emitted polarized light polarized along a polarization direction;
 a display panel configured to receive an illumination light and form an image; and
 a grating system substantially coextensive in length and width with the display panel and the emission surface and comprising a plurality of substantially parallel elongated features extending along an in-plane first direction and arranged along an orthogonal in-plane second direction, the grating system configured to receive and transmit an incident polarized light as a first transmitted light having different first and second polarization states in response to different respective first and second signals applied to the grating system, such that the image formed by the display panel exits the display system as an exiting image having different first and second intensity profiles versus transmission angle in response to the respective first and second signals applied to the grating system.

2. The display system of claim 1, wherein a maximum half divergence angle of the emitted substantially collimated polarized light is less than about 30 degrees.

3. The display system of claim 1, wherein in a plane substantially orthogonal to the display panel, the first and second intensity profiles have respective first and second global maxima at different respective first and second transmission angles.

4. The display system of claim 3, wherein the first and second transmission angles are at least 5 degrees apart.

5. The display system of claim 1, wherein the grating system is disposed between the display panel and the emission surface.

6. The display system of claim 5, wherein the grating system comprises:
 a grating comprising the plurality of substantially parallel elongated features; and
 a switchable retarder disposed between the grating and the emission surface and configured to receive and transmit the emitted polarized light from the emission surface as the first transmitted light having the different first and second polarization states when the switchable retarder is in different respective first and second retarder states.

7. The display system of claim 1, wherein if the grating system is removed from the display system, then in a plane substantially orthogonal to the display panel, the exiting image has an intensity profile having a global peak at a transmission angle of between about −10 and about 10 degrees.

8. The display system of claim 1, wherein the display panel is disposed between the grating system and the emission surface.

9. The display system of claim 8, wherein the grating system comprises:
 a grating comprising the plurality of substantially parallel elongated features; and
 a switchable retarder disposed between the grating and the display panel and configured to receive and transmit light from the image formed by the display panel as the first transmitted light having the different first and second polarization states when the switchable retarder is in different respective first and second retarder states.

10. The display system of claim 1, further comprising a sensor configured to detect a location of a viewer viewing the display panel and apply a sensor signal to the grating system, wherein the applied sensor signal changes as a viewing angle of the viewer changes.

11. The display system of claim 10, wherein the applied sensor signal is configured to maintain a brightness of an image viewed by the viewer as the viewing angle of the viewer changes.

12. A display system comprising:
 a light source configured to emit light;
 a display panel configured to form an image;
 at least one grating spaced apart from the display panel along a thickness direction of the display system and comprising a plurality of substantially parallel elongated features extending along an in-plane first direction and arranged along an orthogonal in-plane second direction; and
 at least one retarder disposed between the at least one grating and the light source and configured to have at least different first and second retardation states, wherein at least in a first plane substantially orthogonal to the display panel, the image formed by the display panel and exiting the display system comprises different first and second intensity profiles versus transmission angle having respective first and second global maxima at different respective first and second transmission angles in response to the respective first and second retardation states of the at least one retarder.

13. The display panel of claim 12, wherein the at least one grating comprises a plurality of gratings and the at least one retarder comprises a plurality of retarders, the gratings and the retarders aligned with each other in one-to-one correspondence, pairs of corresponding gratings and retarders covering different portions of the display panel, so that in the first plane, images formed in at least two of the different portions of the display panel and exiting the display system have different intensity profiles versus transmission angles.

14. The display system of claim 12, wherein the first and second transmission angles are at least 5 degrees apart.

15. A display system comprising:
 a display configured to emit substantially collimated polarized image light from an image formed by the display toward a viewer, the emitted polarized image light polarized along a polarization direction;
 at least one grating spaced apart from the display along a thickness direction of the display system and configured to be between the viewer and the display, the at least one grating comprising a plurality of substantially parallel elongated features extending along an in-plane first direction and arranged along an orthogonal in-plane second direction; and
 at least one retarder disposed between the at least one grating and the display and configured to have at least different first and second retardation states, wherein at least in a first plane substantially orthogonal to the display, the polarized image light emitted by the display and exiting the display system after passing through the at least one retarder and the at least one grating comprises different first and second intensity profiles versus transmission angle having respective first and second global maxima at different respective first and second transmission angles in response to the respective first and second retardation states of the at least one retarder.

* * * * *